United States Patent [19]

Komenou et al.

[11] 4,415,988
[45] Nov. 15, 1983

[54] MAGNETIC BUBBLE MEMORY DEVICE

[75] Inventors: Kazunari Komenou; Tsutomu Miyashita, both of Kawasaki; Makoto Ohashi, Tokyo, all of Japan

[73] Assignee: Fujitsu Limited, Kawasaki, Japan

[21] Appl. No.: 283,182

[22] Filed: Jul. 14, 1981

[30] Foreign Application Priority Data

| Jul. 15, 1980 [JP] | Japan | 55-97341 |
| Feb. 19, 1981 [JP] | Japan | 56-22207 |
| Feb. 20, 1981 [JP] | Japan | 56-22959 |
| Feb. 20, 1981 [JP] | Japan | 56-22960 |
| Feb. 20, 1981 [JP] | Japan | 56-22961 |

[51] Int. Cl.³ .................................. G11C 19/08
[52] U.S. Cl. ............................. 365/16; 365/36; 365/41
[58] Field of Search ................. 365/15, 16, 36, 41

[56] References Cited

U.S. PATENT DOCUMENTS

| 4,176,404 | 11/1979 | Dimyan et al. | 365/15 |
| 4,249,249 | 2/1981 | Bonyhard et al. | 365/36 |
| 4,283,776 | 8/1981 | Nelson | 365/36 |

OTHER PUBLICATIONS

Journal of Applied Physics-vol. 53; No. 3 Mar. 1981, pp. 2377-2379.

Primary Examiner—James W. Moffitt
Attorney, Agent, or Firm—Staas & Halsey

[57] ABSTRACT

A magnetic bubble memory device comprises: a magnetic layer which has a first region having the easy axis of magnetization extending in a certain direction and a second region surrounding said first region and having the easy axis of magnetization substantially perpendicular to that of the first region, said first region defining at least one major loop pattern for propagation of information bubbles and a plurality of minor loop patterns for storage of information bubbles; and an electrical conductor pattern deposited on said magnetic layer in a region in which the major loop pattern and the minor loop patterns are opposed to each other, thereby constructing a transfer gate. The major loop pattern is provided, at the portions thereof substantially opposed to the ends of the minor loop patterns in the transfer gate, with gaps through which the bubbles are transferred between the major loop pattern and the minor loop patterns. The transfer gate is driven by means of a convex-shaped pulse of transfer current.

22 Claims, 35 Drawing Figures

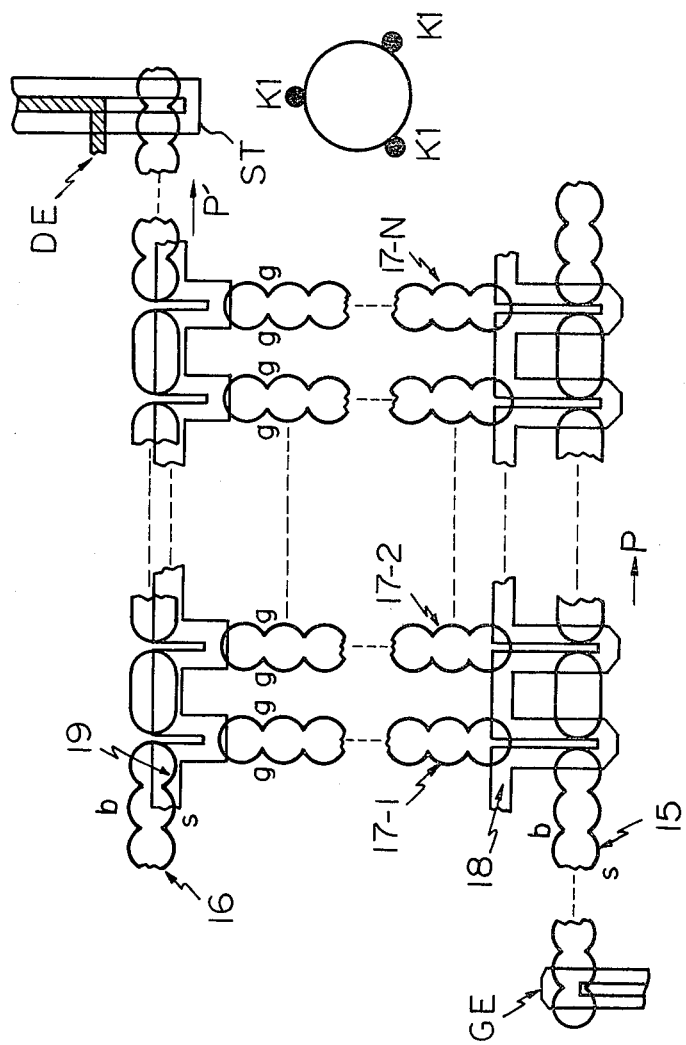

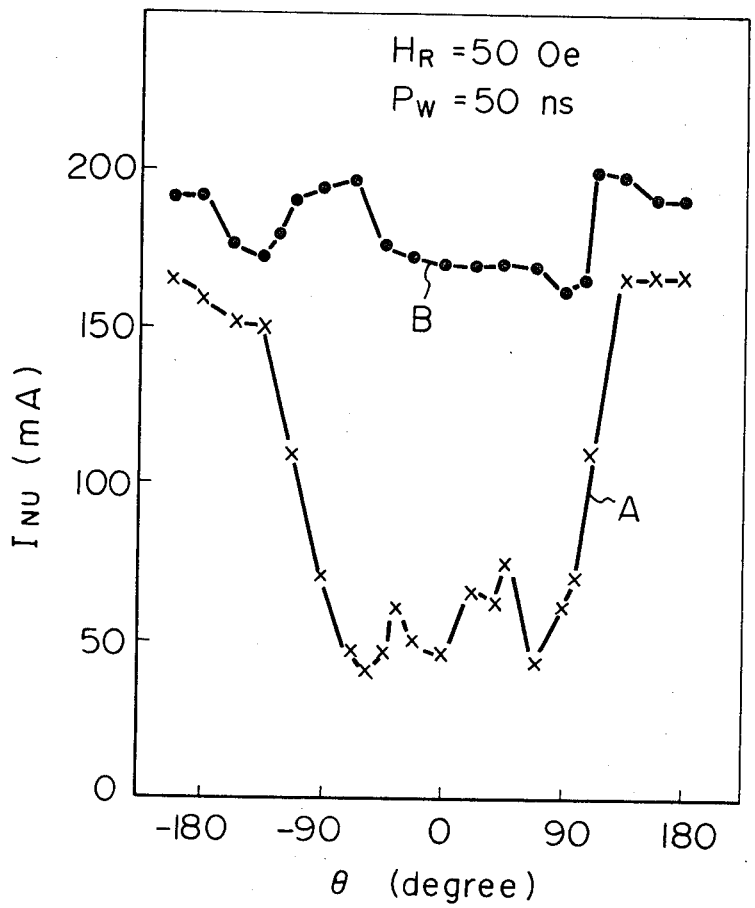

Fig. 22
Fig. 23
Fig. 24
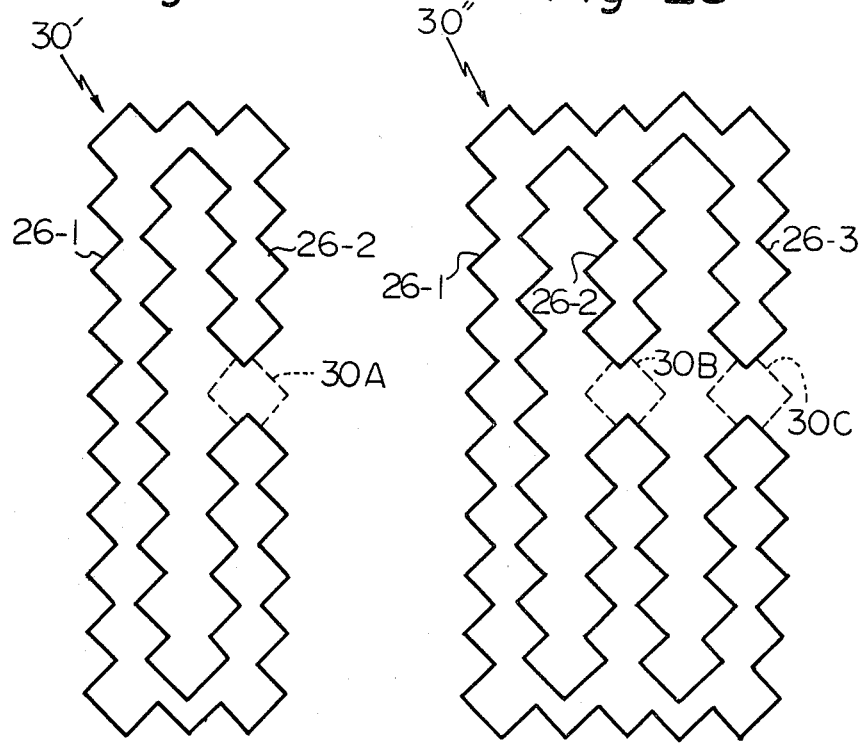
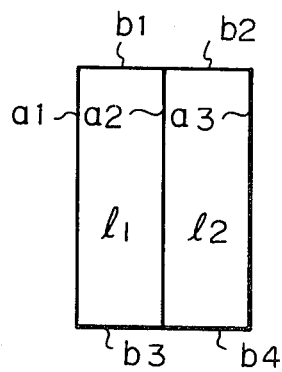

MAGNETIC BUBBLE MEMORY DEVICE

BACKGROUND OF THE INVENTION

The present invention relates to a magnetic bubble memory device and, more specifically, to a transfer gate of a major-minor loop-organized magnetic bubble memory device.

Recently, there have been a number of proposals for approaching to a 4 μm or less high density magnetic bubble memory device. The most efficient one of the proposed approaches is a bubble device comprising: a magnetic layer having a first region having the easy axis of magnetization extending in a certain direction and a second region surrounding said first region and having the easy axis of magnetization substantially perpendicular to that of the first region, said first region defining at least one major loop pattern for propagation of information bubbles and a plurality of minor loop patterns for storage of information bubbles; and an electrical conductor pattern deposited on said magnetic layer with an insulating layer interposed therebetween in a region in which the major loop pattern and the minor loop patterns are opposed to each other, thereby constructing a transfer gate for transfer of information bubbles between the major loop pattern and the minor loop patterns. The second region of the magnetic layer is, in general, made by ion-implantation to the magnetic layer. The major loop pattern and the minor loop patterns are contiguous patterns which may be composed of a plurality of overlapping disk or square patterns.

In a conventional device of the above-mentioned type, however, there is a problem that the operating characteristics of the transfer gate, that is, the bias field margins, the phase margins and the transfer current margins are insufficient for various reasons which will be discussed in detail subsequently, with reference to the drawings. This problem makes it difficult to realize a 4 μm period device.

SUMMARY OF THE INVENTION

It is, therefore, a principal object of the present invention to improve the operating characteristics of the transfer gate in a bubble device of the aforementioned type.

The present invention provides a bubble device of the aforementioned type, wherein the major loop pattern is provided, at the portions thereof substantially opposed to the ends of the minor loop patterns in the transfer gate, with gaps through which the bubbles are transferred between the major loop pattern and the minor loop patterns.

The present invention also provides a bubble device of the aforementioned type, wherein said conductor pattern is formed not to overlap the minor loop patterns.

Further, the present invention provides a bubble device of the aforementioned type, wherein the ends of the minor loop patterns opposed to the major loop pattern in the transfer gate are shaped to be concave or flat.

Still further, the present invention provides a bubble device of the aforementioned type, wherein a plurality of neighboring minor loop patterns are interconnected at their end portions by means of a connecting pattern to define a multi-line minor loop pattern. The multi-line minor loop pattern is provided, at the connecting pattern thereof opposed to the major loop pattern, with a cusp at which the bubbles are transferred between the major loop pattern and the multi-line minor loop pattern.

The present invention also provides a bubble device of the aforementioned type, wherein a plurality of neighboring minor loop patterns are interconnected at their end portions by means of connecting patterns to define a multi-line minor loop pattern. The multi-line minor loop pattern is cut off at a number of portions, thereby defining a full-length bubble propagation path running continuously along the entire periphery of the pattern.

Further, the present invention provides a bubble device of the aforementioned type, wherein the conductor pattern of the transfer gate is supplied with a convex-shaped pulse of transfer current.

Furthermore, the present invention provides a bubble device of the aforementioned type, wherein several features as mentioned above are incorporated in combination.

The present invention will now be described in detail based on preferred embodiments and in contrast with the prior art, with reference to the accompanying drawings.

BRIEF DESCRIPTION OF THE DRAWINGS

FIG. 7 illustrates an embodiment of a bubble device according to the present invention;

FIG. 9 is a graph showing comparatively the characteristics of the transfer gate of the present invention in FIG. 8 and of the conventional transfer gate in FIG. 5;

FIGS. 13, 13A and 13B, 14 and 15 are graphs showing the characteristics of the transfer gate in FIG. 11 in contrast with those in the prior art;

FIG. 22 illustrates another embodiment of a multi-line minor loop pattern;

FIG. 23 illustrates a further embodiment of a multi-line minor loop pattern;

FIG. 24 is an illustration for the purpose of explanation about variations of the multi-line minor loop pattern in FIG. 23;

DETAILED DESCRIPTION

Firstly, the prior art will be described with reference to FIGS. 1 through 6.

Figure 1:
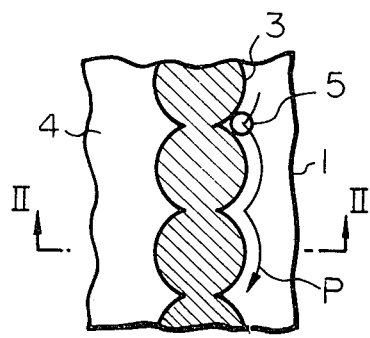
FIG. 1 is a partial plan view of a conventional ion-implanted magnetic bubble propagation pattern.
Figure 2:
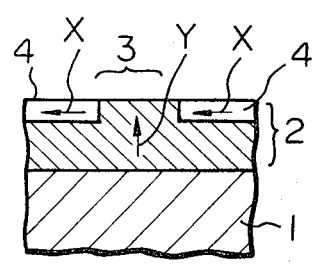
FIG. 2 is a sectional view taken along line II-II in FIG. 1.

FIGS. 1 and 2 illustrate an ion-implanted bubble propagation pattern. A reference numeral 1 designates a substrate of gadolinium gallium garnet (GGG), on which a thin layer 2 of magnetic garnet is deposited by the method of liquid-phase epitaxial growth. The magnetic layer 2 has a first region 3, and a second remainder region 4 in which an ion, such as H, Ne or He is implanted. The second ion-implanted region 4 has the easy axis of magnetization which is in the plane of the layer 2 as shown by an arrow X, and the first region 3 has the easy axis of magnetization which is normal to the plane of the layer 2 as shown by an arrow Y. A bubble 5 is moved along the periphery of the first region 3 by means of a magnetic field rotating in the plane of the layer 2. Therefore, the first region 3 defines a bubble propagation pattern. Such a bubble propagation pattern as mentioned above may be referred to as a contiguous pattern, which may be composed of a plurality of overlapping disk or square patterns and therefore requires no gap, unlike a conventional permalloy pattern. This fact makes it possible to relax the pattern in precision and, accordingly, to provide a smaller pattern and a higher density.

Figure 3:
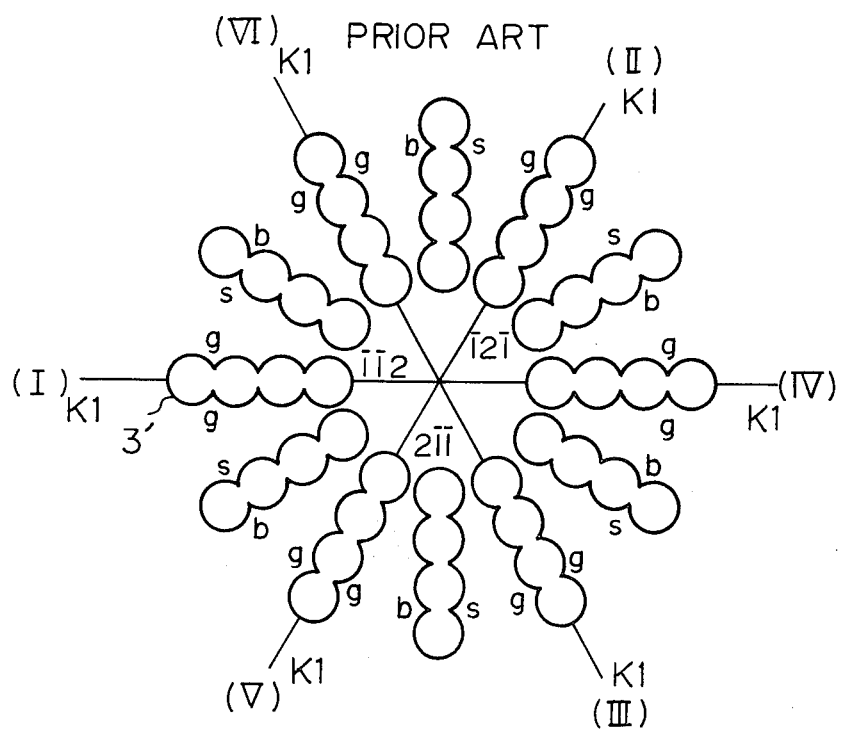
FIG. 3 illustrates the known relationship between the easy axis of magnetization of the bubble supporting layer and the bubble propagation pattern.

In the magnetic layer 2, there are six easy axes of magnetization $K_1$ in the directions (I), (II), (III), (IV), (V) and (VI) which are 60° apart from each other, as illustrated in FIG. 3. These axes are classified into two groups: that is, a group including the axes (I), (II) and (III); and the other group including the axes (IV), (V) and (VI). The axes (I), (II) and (III) are easy axes of striping out. Hereinafter, for simplicity, the axes (I), (II) and (III) are referred to as "easy axes". Depending on what direction the patterns composing the bubble propagation pattern are linearly arranged in with respect to the easy axes of magnetization $K_1$ oriented 60° apart, there are three kinds of bubble propagation path; that is, a super track "s", a bad track "b" and a good track "g". The super track "s" is a propagation path in which the bias field margin is large and the bubble can be easily propagated. The track "b" is a propagation path in which the bias field margin is small and the bubble cannot be easily propagated. The good track "g" is a propagation path in which the operating margin in the bubble propagation is moderate. As illustrated in FIG. 3, the path opposite to the super track "s" is the bad track "b". Both of the paths of the contiguous disk pattern 3' arranged along the axis $K_1$ are the good track "g". This feature is due to a peculiarity of bubble propagation which is caused by the cubic anisotropy of garnet film.

Figure 4:
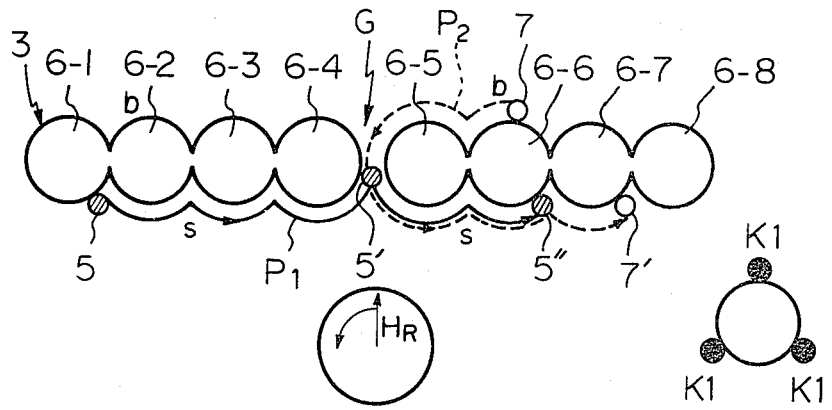
FIG. 4 illustrates the known principle of operation in a bubble propagation path defined by a contiguous disk pattern and having a super track and a bad track.

Referring to FIG. 4, the principle of operation in a propagation path of a contiguous disk pattern having the super track "s" and the bad track "b" will now be described. The propagation pattern 3 is composed of four overlapping disk paterns 6-1 through 6-4 and four overlapping disk patterns 6-5 through 6-8, which are arranged in line with a gap G between the patterns 6-4 and 6-5. The pattern 3 is arranged with respect to the easy axis of magnetization $K_1$ so that the bottom bubble propagation path defines the super track "s" and the top bubble propagation path defines the bad track "b".

It is now assumed that magnetic bubbles 5 and 7 exist on the super track "s" and bad track "b" of the pattern 3, respectively. When a counterclockwise rotating in-plane magnetic field $H_R$ is applied to the magnetic layer 2, the bubble 5 on the super track "s" of the disk pattern 6-1 is propagated successively from the disk pattern 6-1 to the disk pattern 6-4 as shown by a solid line arrow $P_1$ in response to successive rotations of the rotating field. The bubble 5 propagated onto the disk pattern 6-4 moves along the periphery of the disk pattern 6-4 in response to the next rotation of the rotating field. However, the bubble 5 does not turn round to enter the top propagation path, i.e. the bad track "b", of the disk pattern 6-4, but is brought to rest at the gap G as shown by the reference numeral 5'. As the rotating field $H_R$ further rotates, the bubble 5' moves beyond the gap G to the disk pattern 6-5 and, succeedingly, is propagated as shown by reference numeral 5". As mentioned above, there is a feature that, even though a gap exists between the disk patterns, the bubble on the super track "s" continues its propagation along the super track "s", provided that the gap is small enough. On the other hand, the bubble 7 on the bad track "b" of the disk pattern 6-6 is propagated to the adjacent disk pattern 6-5, as shown by a dotted line $P_2$, when the rotating field $H_R$ is applied. In response to the next rotation of the rotating field $H_R$, the bubble 7 moves along the periphery of the disk pattern 6-5. In this case, the bubble 7 cannot cross the gap G, but continues to turn round the disk pattern 6-5 to enter the super track "s". In response to further rotations of the rotating field $H_R$, the bubble 7 is propagated on the super track "s" as shown by the reference numeral 7'. As mentioned above, there is a feature that a bubble on the bad track "b" cannot cross a gap, but moves along the periphery of the disk pattern to enter the super track "s". Therefore, the gap G, when being small enough, has a property that, on one hand, it behaves like a cusp in the propagation pattern for the bubbles propagated on the super track "s" and, on the other hand, it behaves merely like a passage-way for the bubbles propagated on the bad track "b". This property is disclosed in "Design of Bubble Device Elements Employing Ion-Implanted Propagation Patterns" by T. J. Nelson et al, The Bell System Technical Journal, Vol. 59, No. 2, February 1980.

Figure 5:
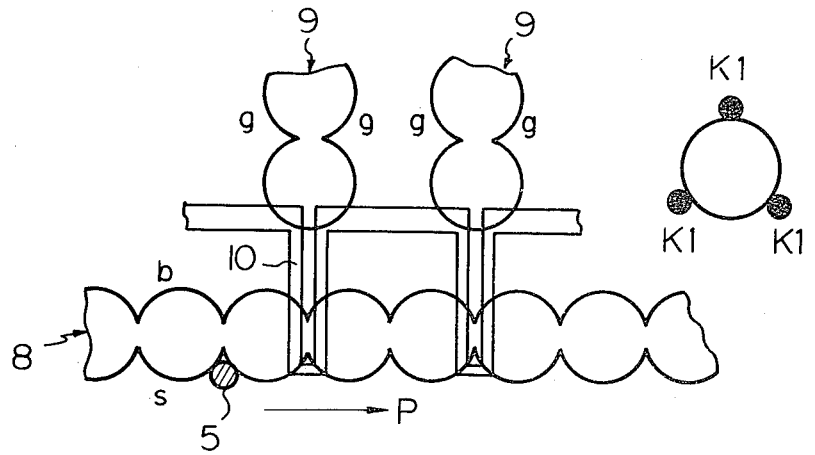
FIG. 5 illustrates a transfer gate in a conventional major-minor loop-organized bubble device.
Figure 6:
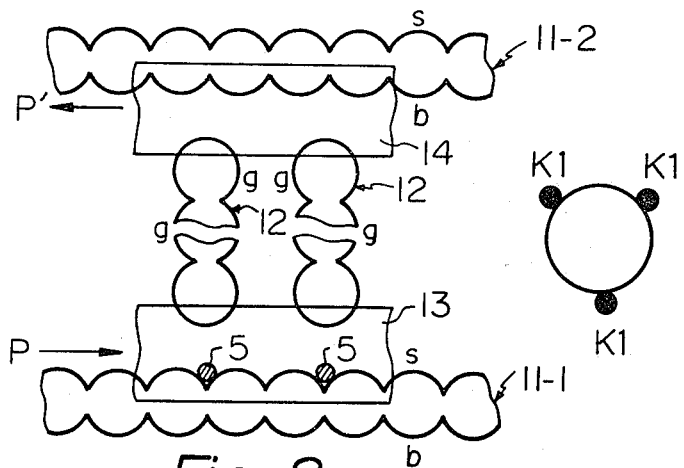
FIG. 6 illustrates another conventional bubble device.

FIGS. 5 and 6 illustrate prior art ion-implanted and major-minor loop-organized magnetic bubble memory devices, which will now be described. FIG. 5 illustrates a transfer-in gate in the first prior art, wherein reference numeral 8 designates a major loop pattern for propagation of the information bubbles, reference numeral 9 designates minor loop pattern for storage of the information bubbles, and reference numeral 10 designates a hairpin-shaped conductor pattern. The conductor pattern 10 is deposited on the magnetic layer with an insulating layer interposed therebetween in a region in which the major loop pattern 8 and the minor loop patterns 9 are opposed to each other, so that the conductor pattern 10 overlaps the major loop pattern 8 and the minor loop patterns 9. The major loop pattern 8 and the minor loop patterns 9 are arranged as illustrated with respect to the easy axes of magnetization $K_1$, so that the major loop pattern 8 defines the super track "s" on its bottom side and the bad track "b" on its top side, and the minor loop pattern 9 defines the good tracks "g" on both its sides. Assume that the information bubble 5 is propagated on the super track "s" of the major loop pattern 8 from the left to the right as shown by an arrow P. When the bubble 5 has reached a predetermined position, a square-shaped pulse of current is applied to the conductor pattern 10 by means of a transfer gate driver (not illustrated), so that the bubble 5 is striped out across the major loop pattern 8 and is transferred to the end of the minor loop pattern 9, resulting in the write-in of information. However, this conventional transfer gate has a problem in that bubble nucleation is easily caused. This results in poor current margins, that is, a small difference between the minimum nucleation current depending on the construction of the transfer gate and the current required to stripe out the bubble across the boundary of the major loop pattern.

FIG. 6 illustrates a transfer-in gate and a transfer-out gate in a second prior art structure, in which stripe-shaped conductor patterns 13 and 14 are deposited on regions in which major loop patterns 11-1, 11-2 and the minor loop patterns 12 are opposed to each other. The major loop and minor loop patterns 11-1, 11-2 and 12 are arranged as illustrated with respect to the easy axes of magnetization $K_1$, so that each of the major loop patterns 11-1, 11-2 defines the super track "s" on its top side and the bad track "b" on its bottom side, and the minor loop pattern 12 defines the good tracks "g" on its opposed sides. When the information bubbles 5 have been propagated to the predetermined positions on the super track "s" of the major loop pattern 11-1 in the direction of arrow P, a pulse of current is applied to the conductor pattern 13 so that the gradient in the magnetic field causes the bubbles 5 to be transferred from the major loop pattern 11-1 to the minor loop patterns 12, thereby resulting in the write-in of information. On the other hand, not-illustrated bubbles on the minor loop patterns 12 are transferred to the bad track "b" of the major loop pattern 11-2 in response to the application of a pulse of current to the conductor pattern 14 in the transfer-out gate and, succeedingly, are propagated in the direction of an arrow P', thereby resulting in the read-out of information. In this prior art, it is not required that the bubbles 5 cross the major loop patterns 11-1, 11-2. However, there is the drawback that the sequence of bubbles in the read-out of information is inverse to that in the write-in of information.

In a conventional transfer gate, moreover, the conductor pattern is formed to overlap the end portions of the minor loop patterns. In this construction, there is the problem that the combined influence of the strain in the conductor pattern due to the fabricating conditions and the magnetic field based on the pulse current cause failures sometimes in operation, such as that the bubble, when being transferred, is stretched in an unexpected direction and transferred to a position on the minor loop pattern other than the predetermined position, or that the bubble propagation along the minor loop pattern after the transfer is disturbed at the end of the minor loop pattern.

In a conventional device, the end of the minor loop pattern in the transfer gate is formed in a circular or square shape. Accordingly, there is further the problem that the period of time of the stay of the charged wall is short and therefore the phase margins and the current margins for transfer of the bubble are insufficient.

Furthermore, in a conventional device, a plurality of linear minor loop patterns are arranged parallel to each other, and the transfer gate is provided for every minor loop pattern. Accordingly, in a high density device, the intervals of the transfer gates are small and the freedom of the design of the gate pattern is poor. Moreover, since the conductor pattern is small in width, there are the problems that the resistance of the gate is large and, accordingly, a high voltage for the drive is required, and further the conductor pattern is poor in reliability.

Still further, in a conventional device, the conductor pattern is supplied with a square-shaped pulse of transfer current for driving the transfer gate. Accordingly, the bias field margins and the current margins are insufficient.

The present invention is made to eliminate the above-mentioned problems in conventional devices. The preferred embodiments of the present invention will now be described with reference to FIGS. 7 through 33.

FIG. 7 is a diagrammatic view of an embodiment of a magnetic bubble memory device according to the present invention, in which are illustrated major loop patterns 15 and 16, minor loop patterns 17-1 through 17-N, hairpin-shaped conductor patterns 18 and 19, a bubble generator GE, a bubble stretcher ST, and a bubble detector DE. Each of the major loop patterns 15 and 16 defines the super track "s" on the bottom side and the bad track "b" on the top side, and each of the minor loop patterns 17-1 through 17-N defines the good tracks "g" on the opposed sides.

When a train of bubbles corresponding to the information has been generated by the bubble generator GE, the bubble train in propagated on the super track "s" of the major loop pattern 15 in the direction of an arrow P in response to the rotation of the counterclockwise rotating field. When the bubble train has reached the position corresponding to the minor loop patterns 17-1 through 17-N, the conductor pattern 18 is supplied with a pulse of current, so that the bubble train is transferred to the ends of the minor loop patterns 17-1 through 17-N. Therefore, the write-in of information from the major loop pattern 15 into the minor loop patterns 17-1 through 17-N is performed. On the other hand, when the information bubbles have come to the predetermined positions on the minor loop patterns 17-1 through 17-N, the conductor pattern 19 is applied with a pulse of current, so that the bubbles on the minor loop patterns 17-1 through 17-N are transferred to the super track "s" of the major loop pattern 16. Therefore, the information is read out of the minor loop patterns 17-1 through 17-N to the major loop pattern 16. The bubbles read out are propagated on the super track "s" of the major loop pattern 16 in the direction of an arrow P' in response of the rotation of the rotating field and, then, detected by the bubble detector DE so that the information is read.

Figure 8:
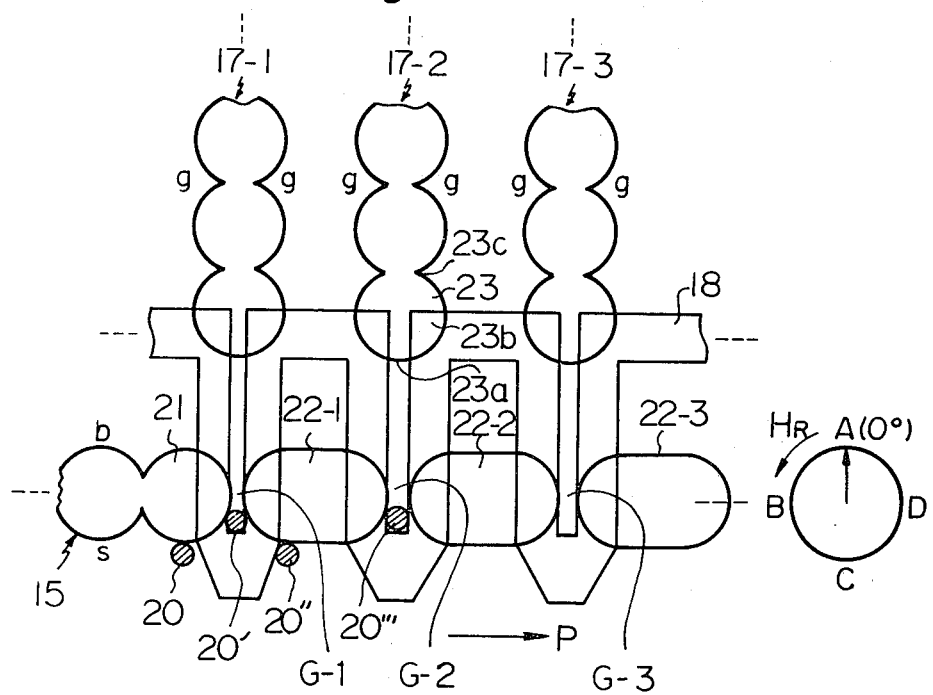
FIG. 8 is an enlarged partial view of a transfer-in gate in the bubble device in FIG. 7.

Referring to FIG. 8, the construction and the operation of the transfer-in gate will be described. The major loop pattern 15 is composed of a plurality of overlapping disk patterns 21 and elongated disk patterns 22-1, 22-2, 22-3, which are arranged in line with gaps G-1, G-2, G-3, therebetween. The gaps G are small enough (about 1 μm) and are opposed to the end disk patterns 23 (hereinafter referred to as "transfer disk patterns") of the minor loop patterns 17-1, 17-2, 17-3, respectively. The conductor pattern 18 is formed to cross the major loop pattern 15 and to overlap the transfer disk patterns 23 of the minor loop patterns 17-1, 17-2, 17-3, with the hairpin loops being aligned with the respective gaps G-1, G-2, G-3.

The operation in which a bubble 20 is stored in the minor loop pattern 17-2 will be described. It is now assumed that, when the rotating field $H_R$ points in the direction C, the underlying bubble 20 exists on the super track "s" of the disk pattern 21 of the major loop pattern 15. As the rotating field $H_R$ rotates counterclockwise, the bubble 20 moves along the periphery of the disk pattern 21, and when the rotating field $H_R$ rotates to approximately the direction D, the bubble 20 moves into the gap G-1 as indicated by 20'. During the period of time in which the rotating field $H_R$ further rotates, successively to the directions A and B, the bubble 20', does not move along the periphery of the disk pattern 21, but stays at the gap G-1, as described hereinbefore with reference to FIG. 4. As the rotating field $H_R$ further rotates to change its orientation from the direction B to the direction C, the bubble 20' moves along the periphery of the elongated disk pattern 22-1 into the position indicated by 20". Further, as the rotating field $H_R$ begins its next rotation to the direction D, the bubble 20" is propagated to the gap G-2 between the elongated disk patterns 22-1 and 22-2, as shown by 20"'. Then, a pulse of current is applied to the conductor pattern 18 to weaken the bias field locally, by which the bubble 20"' is striped out through the gap G-2 so that the end of the stripe domain reaches the end 23a of the transfer disk pattern 23 of the minor loop pattern 17-2. As the rotating field $H_R$ rotates succeedingly, through the directions A and B, to a direction C, the magnetic pole for attracting the bubble 20"' is produced on the transfer disk pattern 23. Accordingly, when the pulse of current applied to the conductor pattern 18 is turned off, the bubble 20"' is transferred to the transfer disk pattern 23. Succeedingly, as the rotating field $H_R$ rotates successively to the directions D and A, the bubble transferred to the minor loop pattern 17-2 moves successively to the positions 23b and 23c on the periphery of the transfer disk pattern 23.

In the above-mentioned transfer gate in which the major loop pattern is provided with gaps, the current margins are sufficient and, accordingly, bubble nucleation in the transfer can be effectively prevented. It is considered that this feature is caused by the following. The first reason is that the minimum nucleation current in the transfer gate is large. FIG. 9 shows the characteristics of the nucleation current $I_{NU}$ versus the phase $\theta$ of the rotating field of the transfer gate according to the present invention in FIG. 8, in contrast with that of the conventional transfer gate in FIG. 5, wherein the rotating field $H_R = 50$ Oe, and the pulse width $P_W = 50$ ns. It will be understood from this figure that the minimum nucleation current of the transfer gate according to the present invention (graph B) is much larger than that of the conventional transfer gate (graph A). The second reason is that, in the transfer gate of the present invention, the required transfer current itself is small, because the bubble is not required to cross the boundary of the major loop pattern. In conclusion, it can be understood that the difference between the transfer current is large and the nucleation current, that is, the current margins are large, thereby making it hard for nucleation to occur.

In the embodiment illustrated in FIG. 7, the read-out major loop pattern 16 is constructed similar to the write-in major loop pattern 15. In the read-out of information, the bubbles on the minor loop patterns 17-1 through 17-N are transferred through the hairpin loops of the conductor pattern 19 to the super track "s" of the major loop pattern 16 and propagated on the super track "s" in the direction of the arrow P'. Accordingly, the sequences of the bubble train in both the write-in of information and the read-out of information are coincident with each other.

Figure 10:
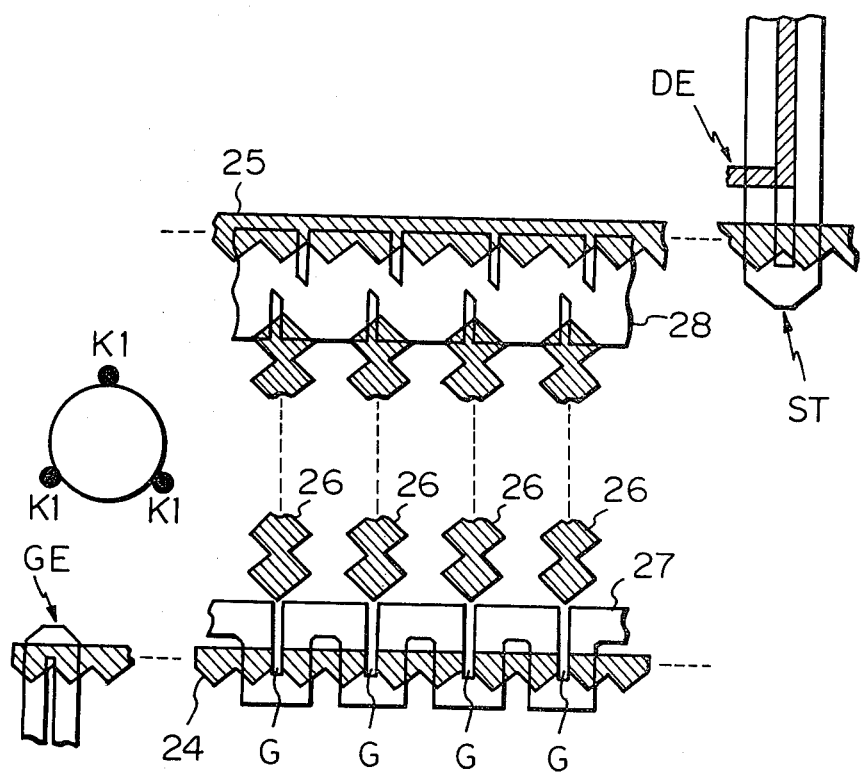
FIG. 10 illustrates another embodiment of a bubble device according to the present invention.

FIG. 10 illustrates another bubble device according to the present invention, which is an improvement on the embodiment in FIG. 7 and which is similar thereto in its basic construction. However, major loop patterns 24 and 25 and minor loop patterns 26 (all are hatched for obviousness) are composed of overlapping square patterns. Moreover, in the transfer-in gate, the major loop pattern 24 is provided with gaps G, and a conductor pattern 27 is hairpin-like shaped. On the other hand, in the transfer-out gate, the major loop pattern 25 is provided with no gap, and a conductor pattern 28 is an N-like shape. The characteristic feature of the device in FIG. 10 resides in that, in the transfer-in gate, the conductor pattern 27 is formed not to overlap the minor loop patterns 26, as are shown enlarged in FIG. 11. In the aforementioned embodiment in FIG. 8, the conductor pattern 18 is formed to overlap the transfer disk patterns 23 of the minor loop patterns 17-1, 17-2, 17-3 as in the prior art in FIG. 5. In this case, as described hereinbefore, such failures in operation are caused by the combined influence of the strain in the conductor pattern 18 and the magnetic field based on the pulse current, so that the bubble 20"' is not transferred to the required position 23a of the disk pattern 23, but is transferred to the other position 23c. In the construction according to the present invention, however, the combined influence of the strain in the conductor pattern 27 and the magnetic field based on the pulse current is small. Accordingly, in the transfer, the bubble is transferred correctly to the end 26a of the minor loop pattern 26 and is prevented from being transferred to the other position 26b. Moreover, in the propagation of the bubble along the minor loop pattern 26 after the transfer, the bubble is stably propagated without being disturbed at the end 26a.

Figure 11:
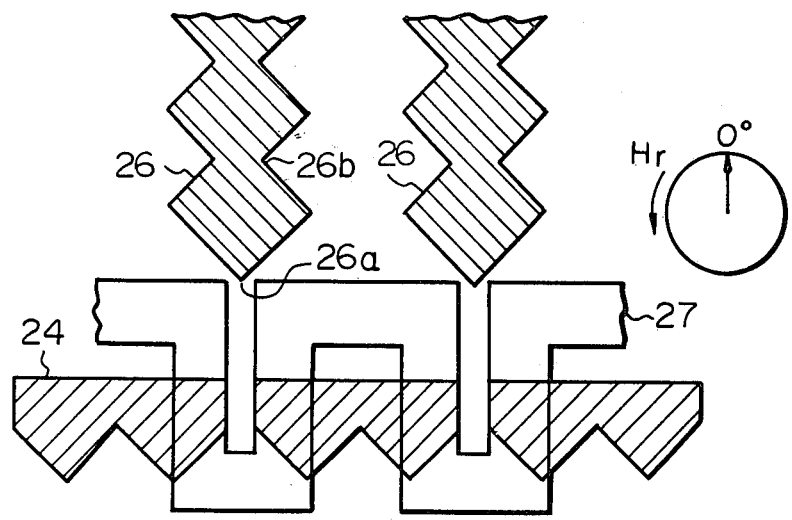
FIG. 11 is an enlarged partial view of a transfer-in gate in the bubble device in FIG. 10.
Figure 12:
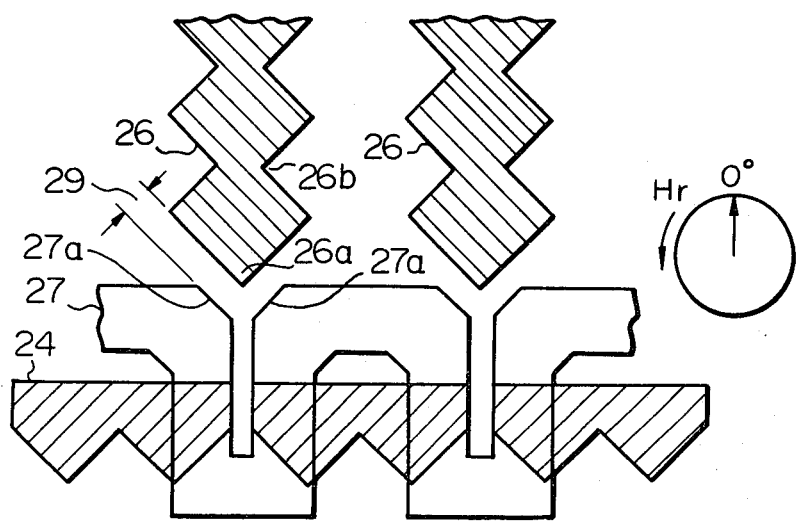
FIG. 12 illustrates another embodiment of a transfer gate according to the present invention.

FIG. 12 illustrates another embodiment of the transfer gate according to the present invention, which is an improvement on the transfer gate in FIG. 11. In this transfer gate, the corner portions 27a of the conductor pattern 27 which are opposed to the end portions of the minor loop patterns 26 are shaped to be flat, so as to provide enough large gaps 29 between the minor loop patterns 26 and the conductor pattern 27. Preferably, the width of the gap 29 is one through four times the bubble diameter. In this construction, the combined influence of the strain in the conductor pattern and the magnetic field based on the pulse current is lesser in contrast with the embodiment in FIG. 11 and, accordingly, the aforementioned failures in operation are more effectively prevented.

Figure 13:
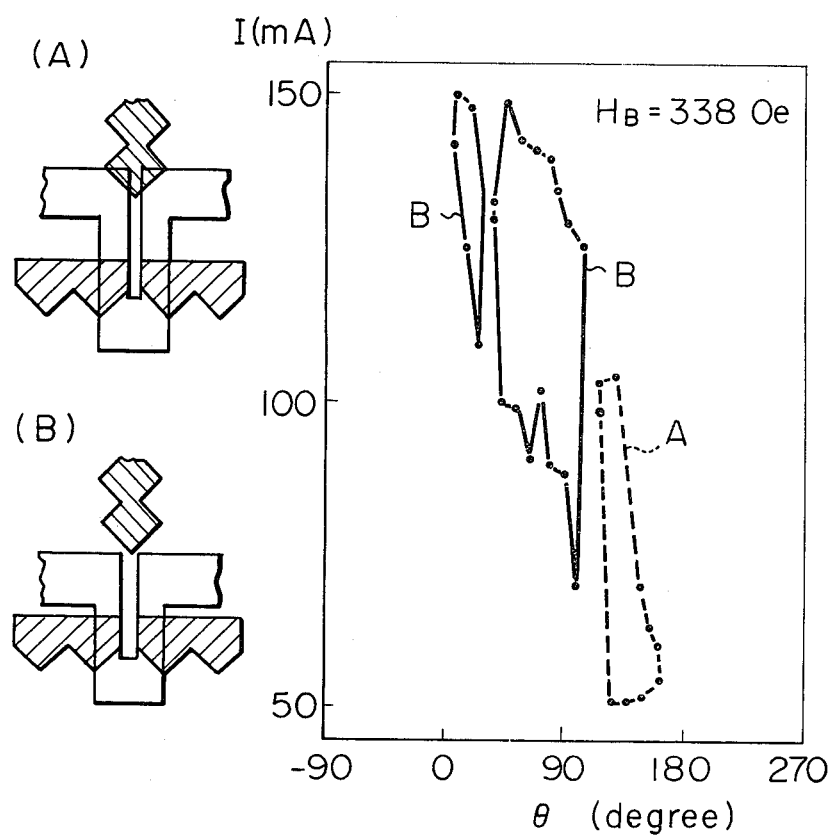
Figure 14:
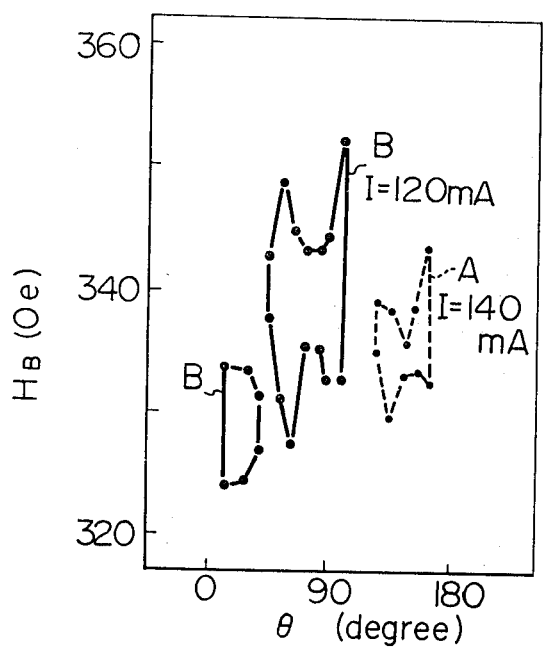
Figure 15:
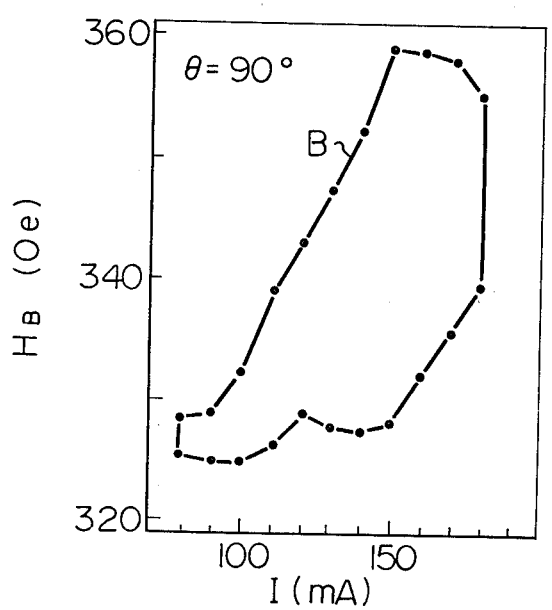

As mentioned above, in the gate constructions in FIGS. 11 and 12, the failures in operation caused by the combined influence of the strain in the conductor pattern and the magnetic field based on the pulse current can be prevented, thereby resulting in the improvement in the current versus phase characteristics and the bias field margins. FIGS. 13, 14 and 15 show comparatively the experimental data of the operating characteristics of both substantially the same transfer gate (designated by A) as the embodiment in FIG. 8 and the transfer gate (designated by B) in FIG. 11. The experimental conditions are as follows: the pulse width of the transfer current I is 0.2 μs; the frequency of the rotating field is, on one hand, 50 KHz for the tranfer gate A and, on the other hand, 300 KHz for the transfer gate B; and the amplitude of the rotating field is 50 Oe. FIG. 13 shows the current versus phase characteristics at the constant bias field $H_B$ of 338 Oe. FIG. 14 shows the bias field margins depending on the phase at the constant transfer current I of, on one hand, 140 mA for the transfer gate A and, on the other hand, 120 mA for the transfer gate B. It will be understood from these figures that the transfer gate B is improved in contrast with the transfer gate A. Moreover, FIG. 15 shows the bias field margins depending on the transfer current at the constant phase $\theta$ of 90° of the transfer gate B only.

Figure 16:
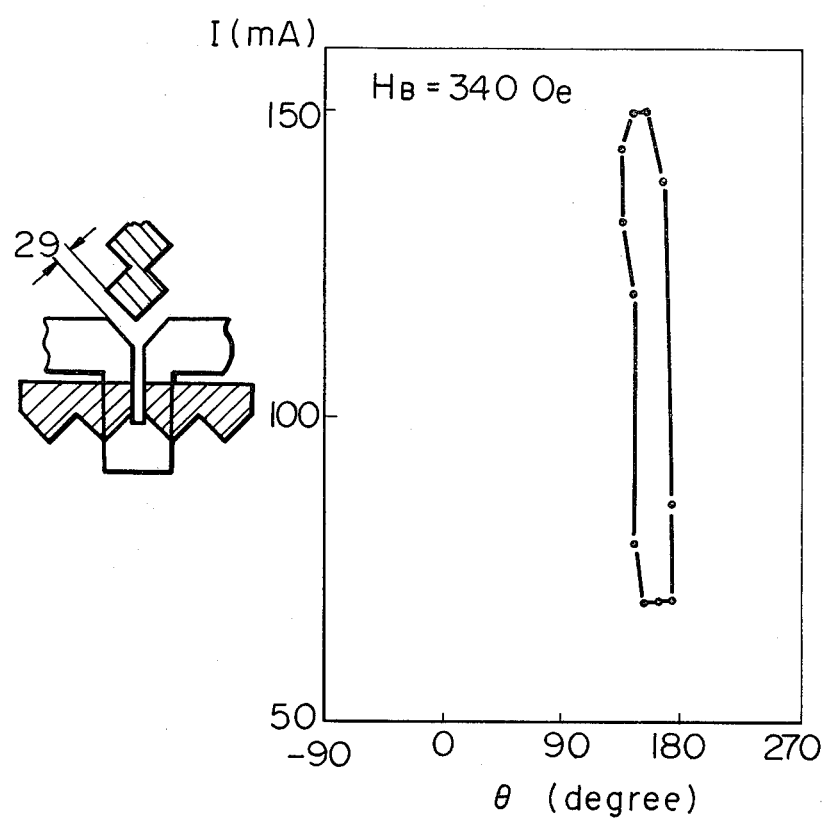
FIGS. 16, 17 and 18 are graphs showing the characteristics of the transfer gate in FIG. 12.
Figure 17:
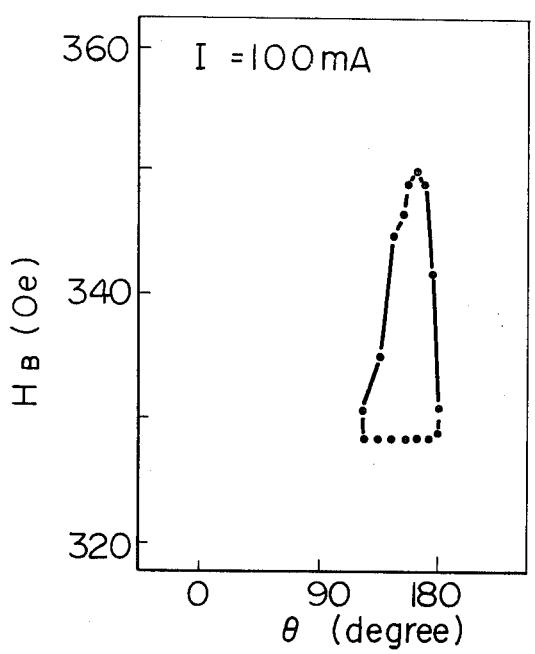
Figure 18:
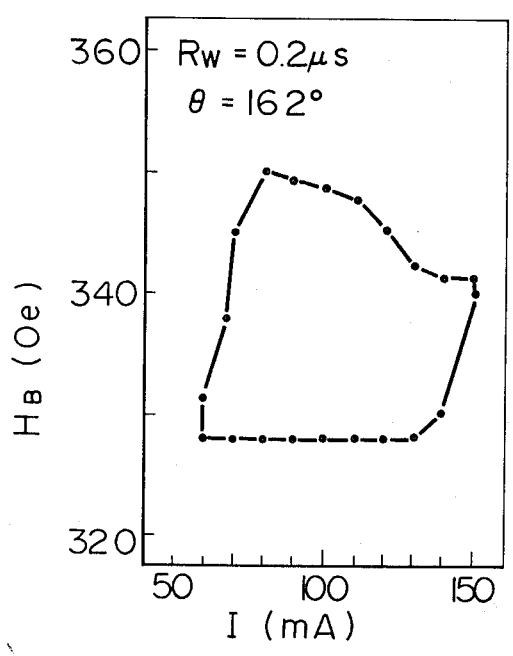

Furthermore, FIGS. 16, 17 and 18 show the operating characteristics of the transfer gate in FIG. 12, wherein the width of the gap 29 between the minor loop pattern 26 and the conductor pattern 27 is twice (2 μm) the bubble diameter, for which the experimental conditions are the same as for the transfer gate B. FIG. 16 shows the current versus phase characteristics at the constant bias field $H_B$ of 340 Oe. FIG. 17 shows the bias field margins depending on the phase at the constant transfer current I of 100 mA. FIG. 18 shows the bias field margins depending on the transfer current at the constant phase $\theta$ of 162°. It will be understood from these figures that the transfer gate in FIG. 12 has more stable characteristics in contrast with the transfer gate in FIG. 11 (designated by B in FIGS. 13 through 15). In particular, the ripples of the bias field as shown in FIGS. 14 and 15 are eliminated.

Figure 19:
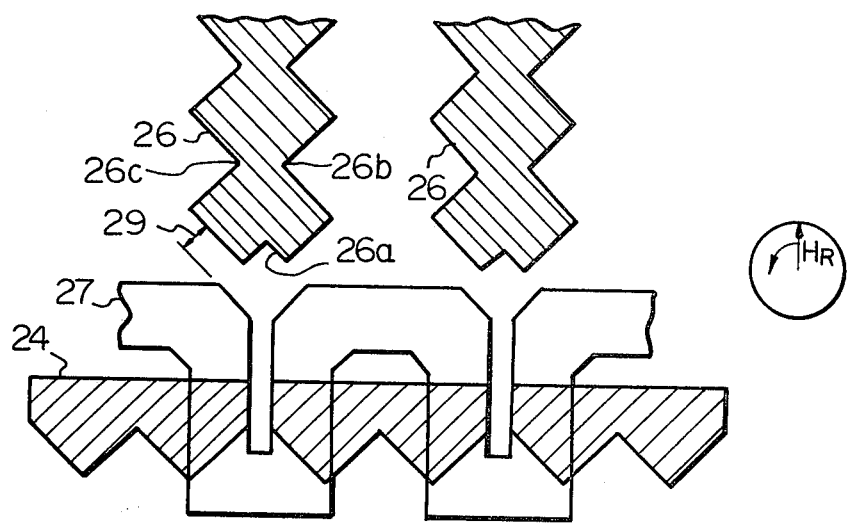
FIG. 19 illustrates a further embodiment of a transfer gate according to the present invention.

FIG. 19 illustrates another embodiment of the transfer gate according to the present invention, which is an improvement on the embodiment in FIG. 12. The characteristic feature of this transfer gate resides in that the end 26a of the minor loop pattern 26 opposed to the major loop pattern 26 is shaped to be concave. The dimensions of the concave end 26a are determined so that the bubble (not illustrated) is propagated from the position 26c, through the position 26a, to the position 26b, in response to one rotation of the rotating field $H_R$. In this construction, the period of time in which the charged wall stays in the minor loop pattern end 26a is long, and accordingly the state ensuring the easy transfer of the bubble from the major loop pattern 24 to the minor loop pattern end 26a can be maintained for so much longer. Therefore, the affinity for the bubble transfer to the minor loop pattern end 26a is large. This feature makes the phase margins wide and, also, the bias field margins on the current large.

Figure 20:
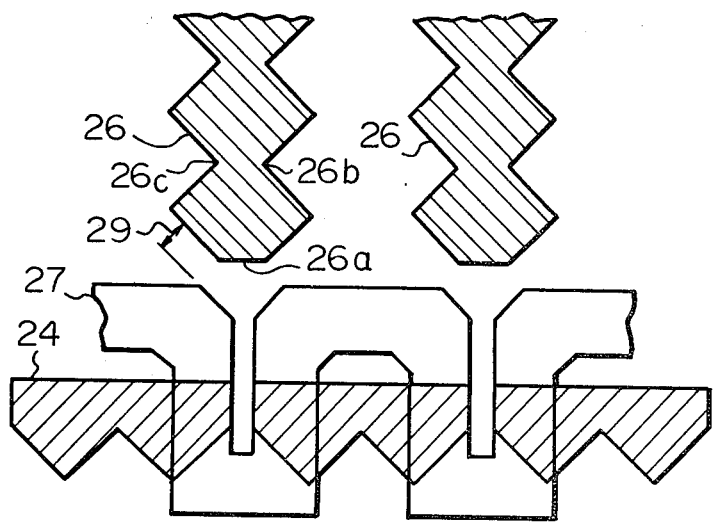
FIG. 20 illustrates a modification of the transfer gate in FIG. 19.

FIG. 20 illustrates a modification of the embodiment in FIG. 19, in which the end 26a of the minor loop pattern 26 is shaped to be flat. The effect in this modification is the same as in the embodiment in FIG. 19.

Figure 21:
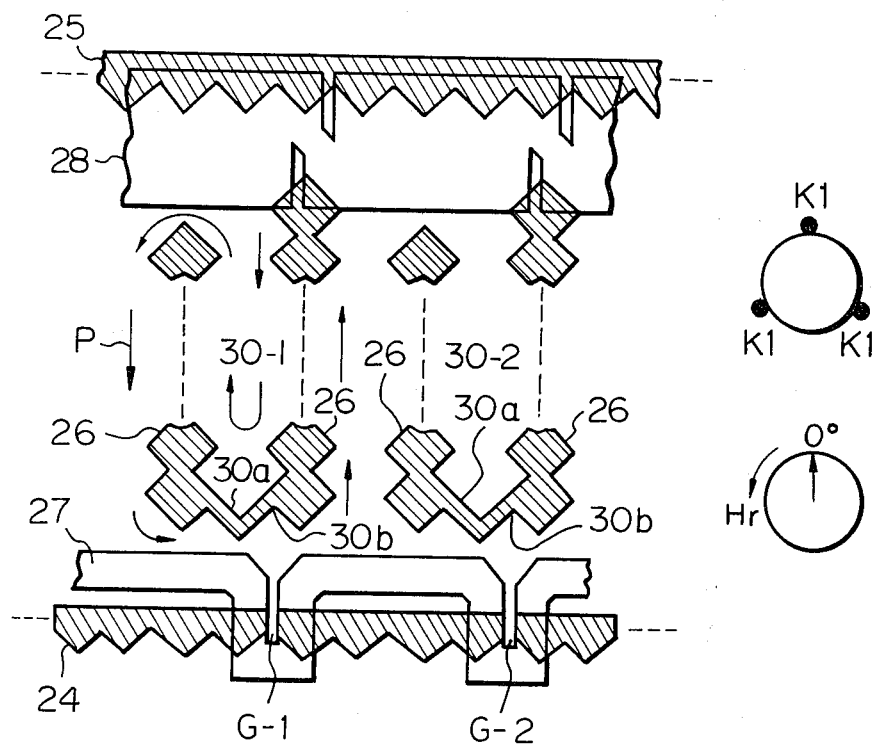
FIG. 21 illustrates a further embodiment of a bubble device according to the present invention.

FIG. 21 illustrates a further embodiment of the bubble device according to the present invention. This embodiment is an improvement on the embodiment in FIG. 10, of which the characteristic feature resides in the constructions of the minor loop and the transfer gate. In the embodiment in FIG. 10, as described hereinbefore, the minor loop is composed of a plurality of linear patterns 26 arranged parallel to each other. In the embodiment in FIG. 21, on the other hand, the minor loop is composed of multi-line patterns 30-1, 30-2, each of which is made U-like shaped by interconnecting two adjacent linear patterns 26 with a connecting pattern 30a at their ends opposed to the write-in major loop pattern 24. The connecting pattern 30a is provided with a cusp 30b. The major loop pattern 24 is provided with gaps G-1, G-2, which are aligned with the cusps 30b of the U-shaped minor loop patterns 30, respectively. Moreover, a conductor pattern 27 has hairpin loops, which are aligned with both of the cusps 30b and the gaps G to construct the transfer-in gates. On the other hand, the transfer-out gate is constructed by depositing an N-shaped conductor pattern 28 on the region in which one end of each of the U-shaped minor loop patterns 30 is opposed to the read-out major loop pattern 25.

In this construction, the bubble transfer in the transfer-in gate is performed at the cusp 30b, at which the charged wall stays during a long period of time. As a result, the phase margins and the current margins are large. Moreover, since the number of transfer-in gates is one-half the number in the prior art, that is, the number of the linear patterns 26, it is possible to double the intervals of the transfer gates in contrast with the prior art. Therefore, the freedom of the design of the transfer gate increases. Furthermore, since the reduction in the number of transfer gates itself makes the resistance of the conductor pattern lower and, in addition, the increased intervals of the transfer gates make it possible to widen the conductor pattern so as to reduce the gate resistance, the required voltage of the gate drive can be greatly lowered.

Another important characteristic feature of the multi-line minor loop pattern 30 in FIG. 21 is that the pattern 30 is open at the portion adjacent to the transfer-out gate, thereby defining a full-length bubble propagation path which runs continuously along the entire periphery of the U-shaped pattern as shown by the arrow P in FIG. 21. This construction ensures almost the same memory density as in the embodiment in FIG. 10.

FIG. 22 illustrates another embodiment of the multi-line minor loop pattern. This pattern 30' is a 2-line pattern similar to that in FIG. 21, in which two linear patterns 26-1, 26-2 are interconnected. In this case, however, the linear patterns 26-1, 26-2 are interconnected at their opposed ends, and the central portion 30A of the linear pattern 26-2 is cut off so as to define the full-length propagation path as mentioned hereinbefore. Also, the linear pattern 26-1 itself may be partially cut off to define the full-length propagation path.

FIG. 23 illustrates a further embodiment of the multi-line minor loop pattern. This pattern 30" is a 3-line pattern, in which three linear patterns 26-1, 26-2, 26-3 are interconnected, and the central portions 30B and 30C of the respective linear patterns 26-2 and 26-3 are cut off to define the full-length propagation path. It should be noted that there are many variations of the 3-line minor loop pattern 30" in arrangement of the cut-off portions of pattern, which will be generally described with reference to FIG. 24. In this figure, three linear patterns are schematically illustrated with references $a_1$, $a_2$ and $a_3$, and four connecting patterns are schematically illustrated with the references $b_1$, $b_2$, $b_3$ and $b_4$. In the 3-line pattern, two closed loops $l_1$ and $l_2$ are defined. In order to define the full-length propagation path, it is necessary to open both of the closed loops $l_1$ and $l_2$, and accordingly two cut-off portions of pattern are required in all. The first closed loop $l_1$ can be opened by providing any one of four patterns $a_1$, $a_2$, $b_1$ and $b_3$ thereof with a cut-off portion, and the second closed loop $l_2$ can be opened by providing any one of four patterns $a_2$, $a_3$, $b_2$ and $b_4$ thereof with a cut-off portion. However, it is not allowable to provide the pattern $a_2$ common to both closed loops $l_1$ and $l_2$ with two cut-off portions. There are fifteen variations in the arrangement the cut-off portion of which satisfy the above-mentioned requirements. The embodiment in FIG. 23 corresponds to one of these variations, in which the patterns $a_2$ and $a_3$ are provided with the cut-off portions 30B and 30C.

As a general rule, the multi-line patterns, in which "n" linear patterns ($n \geq 2$) are interconnected, requires "n-1" cut-off portions to define the full-length propagation path. When "n" is three or more, in particular, there are a number of variations in arrangement of the cut-off portion of the pattern.

Meanwhile, the application of a pulse of current to the conductor pattern of the transfer gate causes the bubble to be transferred from the major loop pattern to the minor loop pattern, and vice versa. In the prior art, however, there is the aforementioned problem that the pulse of transfer current is a square-shaped pulse and, accordingly, the bias field margins and the current margins are insufficient.

Figure 25:
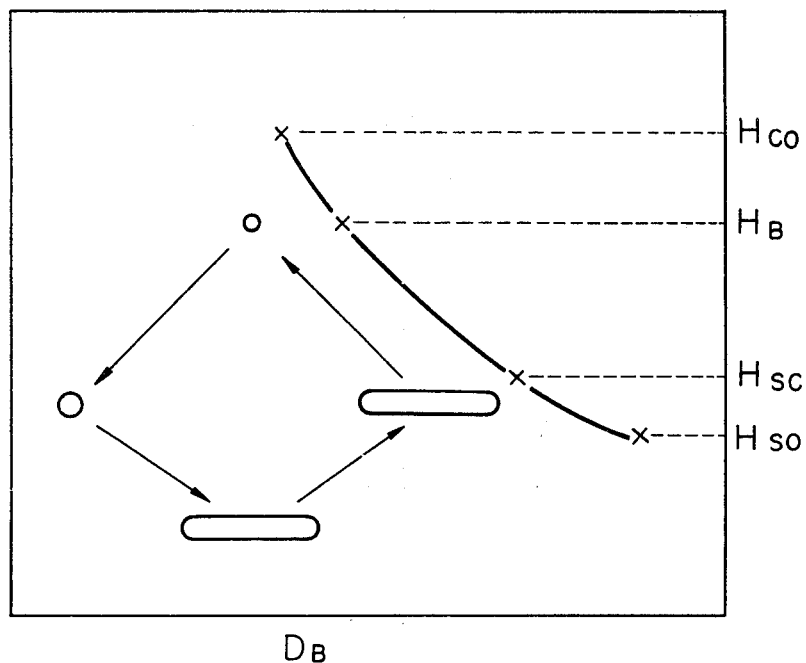
FIG. 25 is an illustration for the purpose of explanation about the transition hysteresis of the magnetic domain.

On the other hand, the dynamic characteristics of the magnetic domain have been studied by Copeland in 1973, and it is well known that there is hysteresis in the transition from the stripe domain to the bubble domain. FIG. 25 shows the bubble diameter versus bias field characteristics. For the magnetic field decreasing from the bias field $H_B$, the bubble is striped out into the stripe domain at the elliptical instability field $H_{SO}$. On the other hand, for the magnetic field increasing towards the bias field $H_B$, the stripe domain does not shrink in length until a field $H_{SC}$, which is appreciably higher than the field $H_{SO}$, is reached.

According to the present invention, the operating characteristics of the transfer gate can be greatly improved by utilizing the above-mentioned transition hysteresis. This is attained by a feature that the pulse of transfer current applied to the conductor pattern to drive the transfer gate is convex-shaped pulse.

Figure 26:
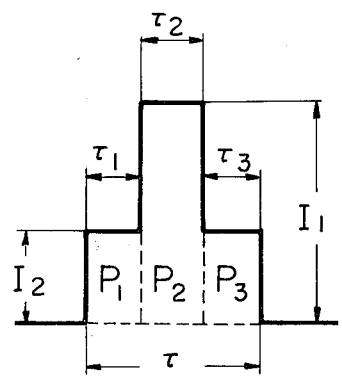
FIG. 26 illustrates a convex-shaped pulse applied to a transfer gate in a bubble device according to the present invention.

FIG. 26 illustrates a convex-shaped pulse according to the present invention, which is composed of three parts, that is, a first base pulse $P_1$, a summit pulse $P_2$ and an end base pulse $P_3$. The first base pulse $P_1$ has the effect of expanding the bubbles so as to make it easy to stripe out the bubbles, the summit pulse $P_2$ effects to stripe out the expanded bubbles into the stripe domain, and the end base pulse $P_3$ effects to maintain the stripe domain constant in length until the position to which the bubble is to be transferred becomes attractive. In FIG. 26, $\tau_1$, $\tau_2$ and $\tau_3$ designate the widths of the pulses $P_1$, $P_2$ and $P_3$, respectively, $I_1$ designates the current of the summit pulse $P_2$, and $I_2$ designates the currents of the base pulses $P_1$ and $P_3$.

According to the convex-shaped pulse mentioned above, it is possible to make the width $\tau_2$ of the summit pulse $P_2$ narrower than that of the conventional square-shaped pulse. Consequently, the bias field margins and the current margins can be improved in contrast with those based on the conventional square-shaped pulse.

Figure 27:
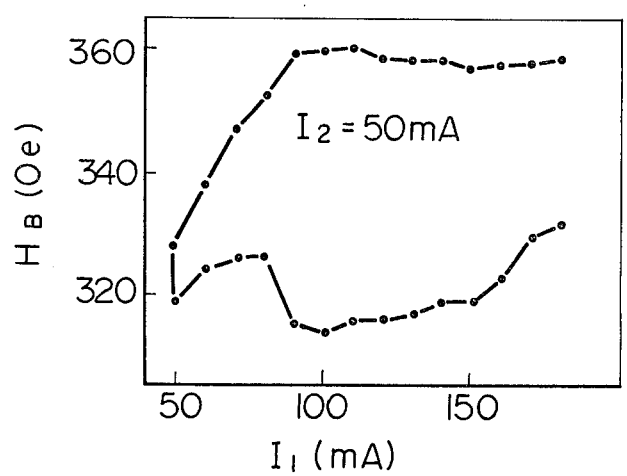
FIGS. 27, 28, 29 and 30 are graphs showing the characteristics of a transfer gate depending on the variations of parameters $I_1$, $I_2$, $\tau_1$ and $\tau_3$ of the convex-shaped pulse in FIG. 25.
Figure 28:
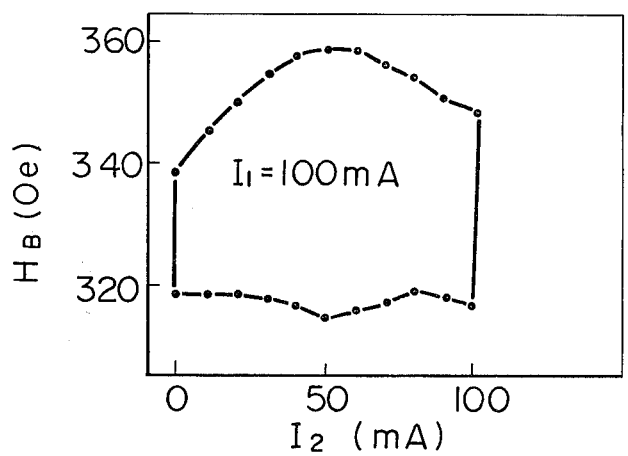
Figure 29:
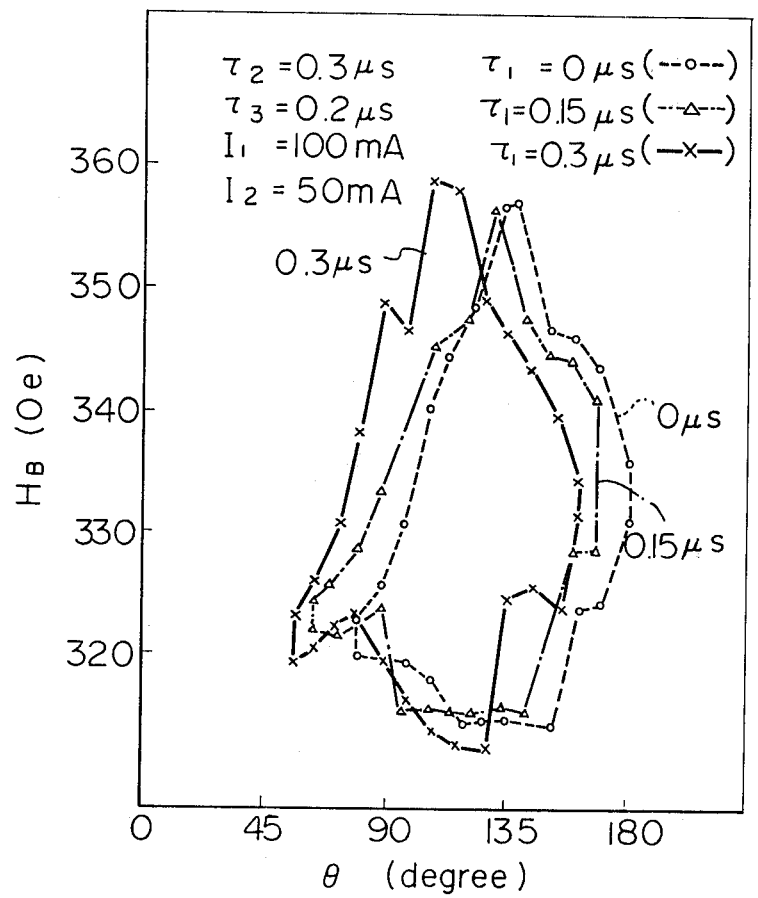
Figure 30:
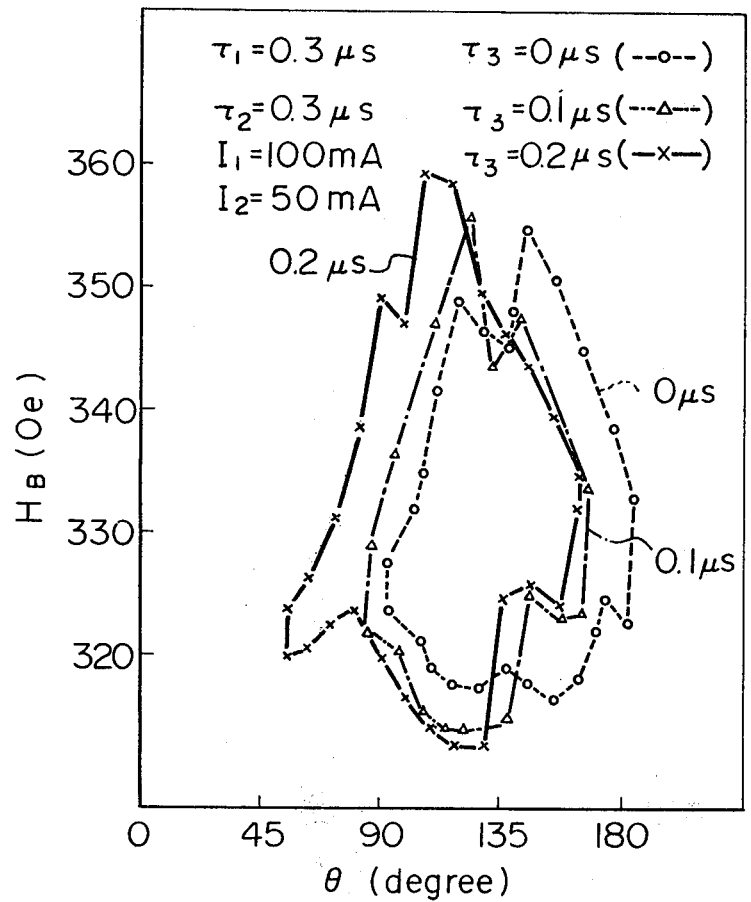

FIGS. 27 through 30 show the experimental data of the operating characteristics in the case wherein the above-mentioned convex-shaped pulse of current is applied to the transfer gate in FIG. 12. FIG. 27 shows the bias field margins depending on the summit pulse current $I_1$ at the constant base pulse current $I_2$ of 50 mA. FIG. 28 shows the bias field margins depending on the base pulse current $I_2$ at the constant summit pulse current $I_1$ of 100 mA. It will be understood from these figures that the best margins are obtained when the summit pulse current $I_1$ is 100 mA and the base pulse current $I_2$ is 50 mA. FIGS. 29 and 30 show the bias field versus phase characteristics depending on the pulse widths $\tau_1$ and $\tau_3$, respectively, at the constant pulse currents $I_1$ of 100 mA and $I_2$ of 50 mA. In FIG. 29, the summit pulse width $\tau_2$ is constant at 0.3 $\mu$s, the end base pulse width $\tau_3$ is constant at 0.2 $\mu$s, and the first base pulse width $\tau_1$ is varied to 0 $\mu$s, 0.15 $\mu$s and 0.3 $\mu$s. In FIG. 30, the summit pulse width $\tau_2$ is constant at 0.3 $\mu$s, the first base pulse width $\tau_1$ is constant at 0.3 $\mu$s, and the end base pulse width $\tau_3$ is varied to 0 $\mu$s, 0.1 $\mu$s and 0.2 $\mu$s. It will be understood from these figures that the best bias field margins are obtained when the first base pulse width $\tau_1$ is 0.3 $\mu$s and the end base pulse width $\tau_3$ is 0.2 $\mu$s.

Figure 31:
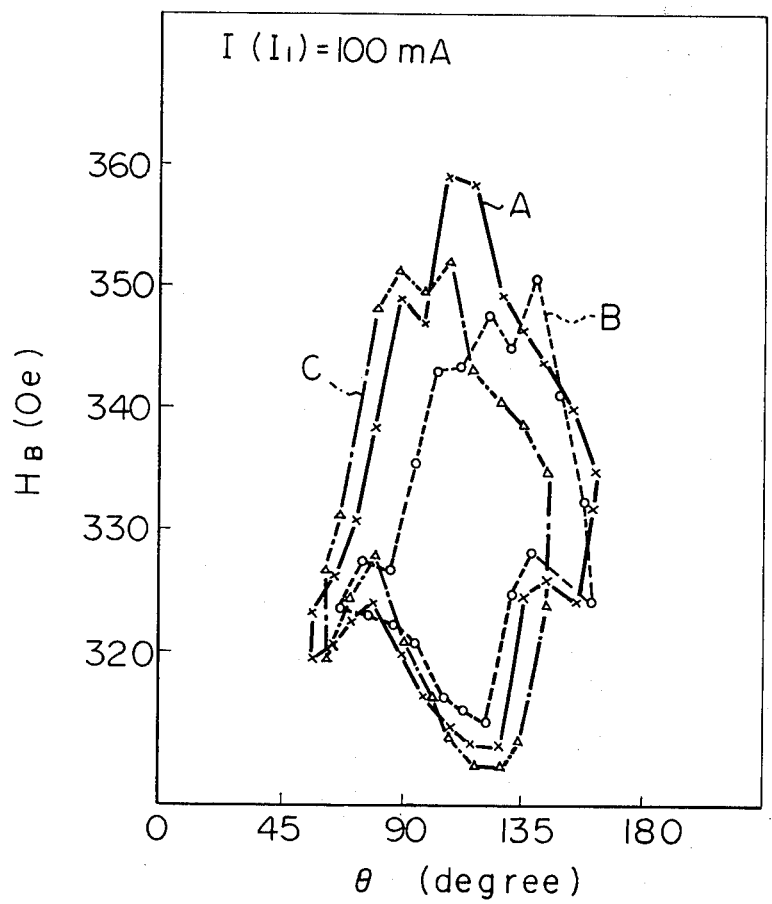
FIGS. 31, 32 and 33 are graphs showing comparatively the characteristics of a transfer gate based on a convex-shaped pulse according to the present invention and a conventional square-shaped pulse.
Figure 32:
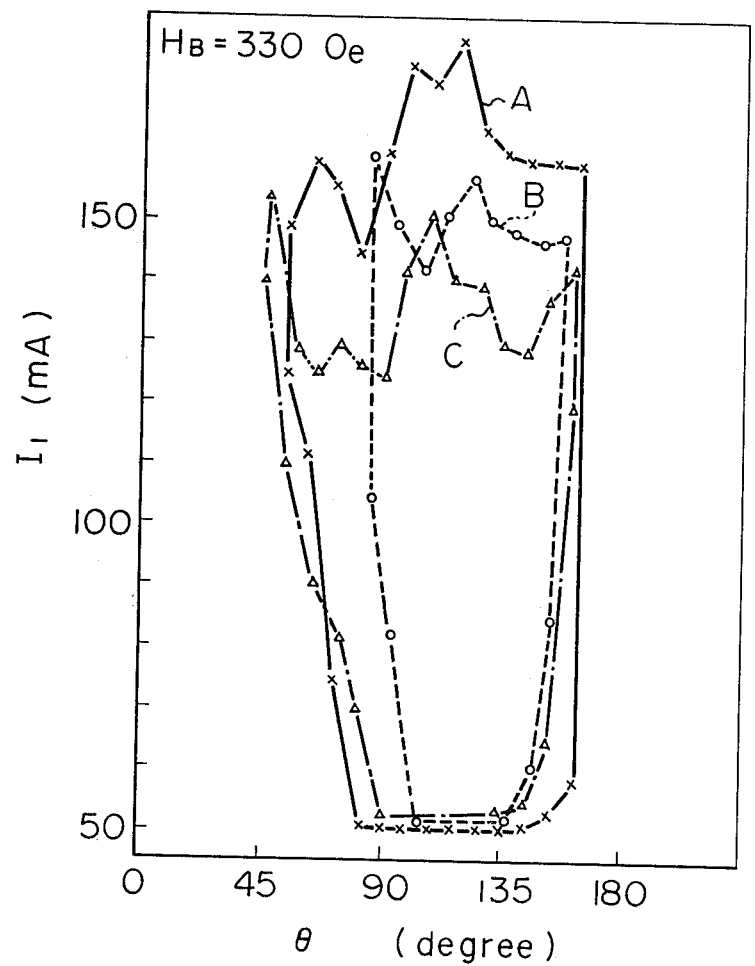
Figure 33:
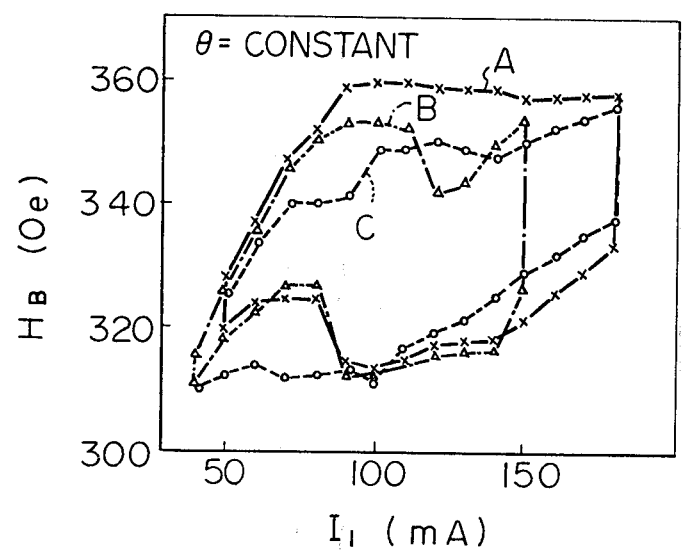

FIGS. 31 through 33 show comparatively the characteristics based on the convex-shaped pulse according to the present invention and the conventional square-shaped pulse. In these figures, the graph A concerns the convex-shaped pulse, wherein the first base pulse width $\tau_1$ is 0.3 $\mu$s, the summit pulse width $\tau_2$ is 0.3 $\mu$s, and the end base pulse width $\tau_3$ is 0.2 $\mu$s. The graph B concerns the square-shaped pulse of 0.3 $\mu$s width, and the graph C concerns the square-shaped pulse of 0.8 $\mu$s width. FIG. 31 shows the bias field margins depending on the phase at the constant pulse current I (the summit pulse current $I_1$ for the convex-shaped pulse) of 100 mA. FIG. 32 shows the current margins depending on the phase at the constant bias field margin $H_B$ of 330 Oe. FIG. 33 shows the bias field margins depending on the current at the constant phase $\ominus$, which is 110° for the convex-shaped pulse A, $\mu$s 145° for the 0.3 $\mu$s width square-shaped pulse B, and of 110° for the 0.8 $\mu$s width square-shaped pulse C. It will be understood from these FIGS. 31 through 33 that the convex-shaped pulse according to the present invention is superior to the square-shaped pulse.

It should be noted that the present invention is applicable to either case in which the major loop pattern and the minor loop patterns are composed of disk patterns or square patterns.

We claim:

1. A magnetic bubble memory device comprising:
   a magnetic layer having a first region in which the easy axis of magnetization extends in a first direction and a second region surrounding said first region in which the easy axis of magnetization is substantially perpendicular to said first direction, said first and second regions defining a major loop pattern for propagation of information bubbles and a plurality of minor loop patterns for storage of information bubbles, each said minor loop pattern having a first portion in the vicinity of a respective part of said major loop pattern, said major loop pattern having a gap in each said respective part thereof; and
   an electrical conductor pattern on said magnetic layer, with an insulating layer therebetween, to form a hairpin-shaped pattern extending between said first portion of each said minor loop pattern and the respective gap in said major loop, wherein transfer gates are thusly provided for transfer of information bubbles between the major loop pattern and the minor loop patterns.

2. The device of claim 1, wherein each said hair pin-shaped pattern has a loop traversing the major loop pattern.

3. The device of claim 1, wherein each said hair pin-shaped pattern is formed so as not to overlap the minor loop patterns.

4. The device of claim 3, wherein each said hairpin-shaped pattern is spaced apart from the respective first portion of the respective minor loop pattern in the plane of said magnetic layer at a distance in the range from one to four times the bubble diameter.

5. The device of claim 3 or 4, wherein said hairpin-shaped pattern at each said first portion of a respective minor layer pattern has corner portions that are diagonally shaped so as to be flat for a distance along which said bubbles are transferred.

6. The device of claim 1, wherein each said first portion of said minor loop patterns has a part facing the major loop pattern that is selectively shaped to be concave or flat.

7. The device of claim 1, wherein each said minor loop pattern comprises a multi-line minor loop pattern, and each said multi-line minor loop pattern is provided at said first portion of the respective minor loop with a cusp at which the bubbles are transferred between the major loop pattern and the multi-line minor loop pattern.

8. A device according to claim 1, each said minor loop pattern comprising a multi-line minor loop pattern, each said multi-line minor loop pattern being cut off at a number of portions thereof for defining a full-length bubble propagation path running continuously along the entire periphery of the multi-line minor loop pattern.

9. The device of claim 8, wherein each said multi-line minor loop pattern is provided, at each said first portion thereof, with a cusp at which the bubbles are transferred between the major loop pattern and the multi-line minor loop pattern.

10. The device of claim 1, 2, 3, 4, 6, 7, 8 or 9, comprising means for applying a convex-shaped transfer current pulse to each said transfer gate.

11. The device of claim 10, wherein said convex-shaped pulse comprises three parts;
a first base pulse having a current value for causing a bubble that is to be transferred to expand so as to make it easy to stripe out the bubble;
a summit pulse having a current value for causing the expanded bubble to be striped out into the stripe domain; and
an end base pulse having a current value for causing the stripe domain to be maintained in length until the position to which the bubble is to be transferred becomes attractive.

12. A magnetic bubble memory device comprising:
a magnetic layer having a first region in which the easy axis of magnetization extends in a first direction and a second region surrounding said first region in which the easy axis of magnetization is substantially perpendicular to said first region, said first and second regions defining a major loop pattern for propagation of information bubbles and a plurality of minor loop patterns for storage of information bubbles, each said minor loop pattern having a first portion in the vicinity of a respective part of said major loop pattern; and
an electrical conductor pattern on said magnetic layer with an insulating layer therebetween, extending between the respective parts of the major loop pattern and said first portions of the minor loop patterns, wherein transfer gates are thusly provided for selective transfer of the information bubbles between the major loop pattern and the minor loop patterns, and wherein said conductor pattern is formed so as not to overlap the minor loop patterns.

13. The device of claim 12, wherein said conductor pattern includes a hairpin-shaped pattern at each said transfer gate.

14. The device of claim 12, wherein said conductor pattern is separated from the minor loop pattern in the plane of said magnetic layer at a distance in the range from one to four times the bubble diameter.

15. The device of claim 12, 13 or 14, wherein the corner portions of the conductor pattern opposed to said first portions of the minor loop patterns are diagonally shaped so as to be flat at a point past which said bubbles are transferred.

16. A Magnetic bubble memory device comprising:
a magnetic layer having a first region in which the easy axis of magnetization is in a first direction and a second region surrounding said first region in which the easy axis of magnetization is substantially perpendicular to said first direction, said first and second regions defining a major loop pattern for propagation of information bubbles and a plurality of minor loop patterns for storage of the information bubbles, each said minor loop pattern having a first portion in the vicinity of a respective part of said major loop pattern; and
an electrical conductor pattern on said magnetic layer with an insulating layer therebetween, extending between the respective part of major loop pattern and said first portion of each said minor loop pattern, wherein transfer gates are thusly provided for transfer of the information bubbles between the major loop pattern and the minor loop patterns;
each said transfer gate not overlapping the respective minor loop pattern.

17. The device of claim 16, wherein each said first portion of said minor loop patterns has a part facing said major loop pattern that is shaped to be concave or flat.

18. The device of claim 16, wherein a each said minor loop pattern comprising a multi-line minor loop pattern, and each said multi-line minor loop pattern being provided at said first portion of the respective minor loop with a cusp at which the bubbles are transferred between said major loop pattern and each said multi-line minor loop pattern.

19. A device according to claim 16, wherein
each said minor loop pattern comprises a multi-line minor loop pattern, each said multi-line minor loop pattern being cut off at a number of portions so as to define a full-length bubble propagation path running continuously along the entire periphery of the multi-line minor loop pattern, and
each said multi-line minor loop pattern is provided, at said first portion of the respective minor loop pattern, with a cusp at which the bubbles are transferred between said major loop pattern and each said multi-line minor loop pattern.

20. The device of claim 16, 17, 18 or 19, wherein the conductor pattern of each said transfer gate is supplied with a convex-shaped transfer current pulse.

21. The device of claim 1, 2, 3, 4, 6, 12, 13, 14, 16 or 17, each said first portion of each said minor line pattern being an end of the respective minor loop pattern.

22. The device of claim 12, 13, 14, 16, 17 or 18, each said respective part of said major loop pattern having a respective gap with which the respective transfer gate is aligned.

* * * * *

UNITED STATES PATENT AND TRADEMARK OFFICE
CERTIFICATE OF CORRECTION

PATENT NO. : 4,415,988
DATED : 15 Nov. 1983
INVENTOR(S) : Komenou et al

It is certified that error appears in the above-identified patent and that said Letters Patent is hereby corrected as shown below:

Col. 4,  line 8, "paterns" should be --patterns--;
         Line 67, after "designates" insert --a--.

Col. 5,  line 39, "pattern" should be --patterns--.

Col. 8,  line 1, delete "is large";
         line 2, after the first occurrence of "current" insert --is large--.

Col. 11, line 11, after "arrangement" insert --of--;
         line 12, delete "of".

Col. 12, line 42, delete the first occurrence of "µs";
         line 43, delete "of".

Col. 13, line 7, "hair pin-" should be --hairpin- --;
         line 10, "hair pin-" should be --hairpin- --.

Col. 14, line 52, delete "a";
         line 53, "comprising" should be --comprises--;
         line 54, "being" should be --is--.

Signed and Sealed this

Twenty-first Day of August 1984

[SEAL]

Attest:

GERALD J. MOSSINGHOFF

Attesting Officer   Commissioner of Patents and Trademarks